United States Patent [19]

Leach, Jr.

[11] 4,206,370
[45] Jun. 3, 1980

[54] SERIAL-PARALLEL-LOOP CCD REGISTER

[75] Inventor: George S. Leach, Jr., Phoenix, Ariz.

[73] Assignee: Motorola, Inc., Schaumburg, Ill.

[21] Appl. No.: 910,267

[22] Filed: May 30, 1978

Related U.S. Application Data

[63] Continuation of Ser. No. 752,760, Dec. 20, 1976, abandoned.

[51] Int. Cl.² .................. G11C 19/28; H03K 5/00; H01L 29/78
[52] U.S. Cl. ....................... 307/221 D; 357/24; 307/238; 365/183
[58] Field of Search ............. 357/24; 307/221 D, 238; 365/183

[56] References Cited

U.S. PATENT DOCUMENTS

| | | | |
|---|---|---|---|
| 3,913,077 | 10/1975 | Erb | 357/24 |
| 3,921,194 | 11/1975 | Engeler et al. | 357/24 |
| 3,971,003 | 7/1976 | Kosonocky | 357/24 |
| 3,986,176 | 10/1976 | Weimer | 357/24 |
| 4,139,910 | 2/1979 | Anantha et al. | 365/183 |

OTHER PUBLICATIONS

Sequin, "Two-Dimensional Charge-Transfer Arrays", IEEE J. Solid-State Circuits, vol. SC-9, (6/74) pp. 134–142.

Primary Examiner—Gene M. Munson
Attorney, Agent, or Firm—Joe E. Barbee

[57] ABSTRACT

A charge coupled device (CCD) register includes a first group of CCD cells coupled horizontally together. Each of the CCD cells includes a "first phase location" and a "second phase location". The register includes a plurality of CCD loops, each of the CCD loops beginning at the first phase location of a respective one of the CCD cells and ending at the second phase location of the same CCD cell. Each of the CCD loops includes the same number of sequentially coupled CCD cells. The CCD register has a very high density of CCD cells, and requires far fewer regeneration devices than a serial CCD register with the same number of CCD cells.

13 Claims, 3 Drawing Figures

SERIAL-PARALLEL-LOOP CCD REGISTER

This is a continuation of application Ser. No. 752,760 filed Dec. 20, 1976 and now abandoned.

BACKGROUND OF THE INVENTION

1. Field of the Invention

The invention relates to CCD registers.

2. Brief Description of the Prior Art

Charge coupled device (CCD) registers are quite well known in the art. They provide a relatively high density, low cost approach to building serial shift registers, as well as other storage devices. A problem that exists with known CCD registers, however, is that every time a charge packet is transferred it degenerates somewhat so that regeneration devices need to be provided approximately every twenty or so CCD cells to boost the magnitude of the charge packets. Such charge regeneration devices frequently take the form of MOS inverters, and require additional power supply conductors in the CCD register and occupy a considerable amount of semiconductor area, and are therefore undesirable because of added complexity and reduction of overall density of CCD cells in the CCD register.

SUMMARY OF THE INVENTION

It is an object of the invention to provide a very high density charge coupled device register structure requiring a minimum number of charge regeneration devices.

Another object of the invention is to provide a serial-parallel-loop charge coupled device shift register.

Briefly described, the invention is a serial-parallel-loop charge coupled device storage means including a plurality of sequentially coupled charge coupled device cells, each cell having a first phase location and a second phase location associated therewith. The storage means also includes a plurality of charge coupled device loops, each of the charge coupled device loops including a respective one of the sequentially coupled charge coupled device cells, and beginning at the first phase location of that respective charge coupled device cell and ending at the second phase location of that respective charge coupled device cell.

DESCRIPTION OF THE INVENTION

Figure 1:
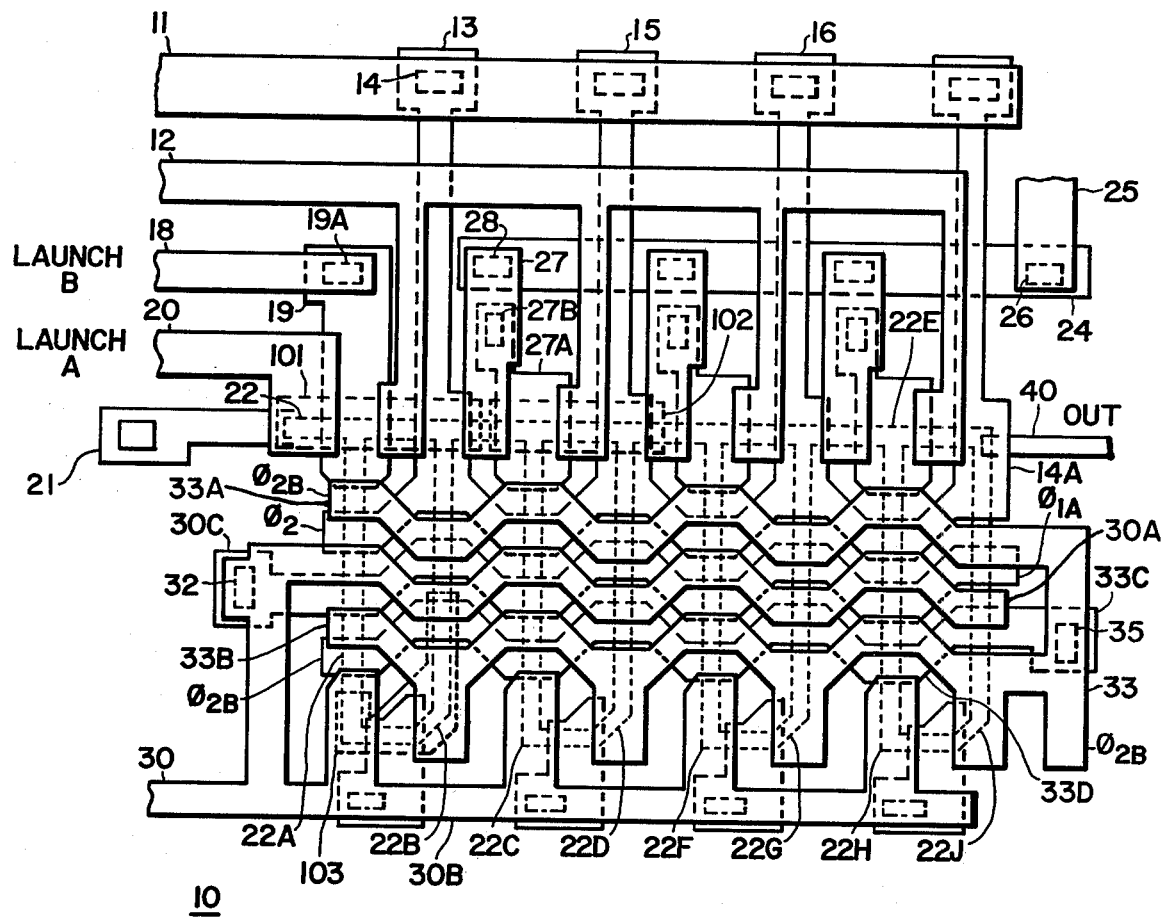
FIG. 1 is a topographical view of a serial-parallel-loop CCD register according to the invention.

FIG. 1 is a topographical view of a series-parallel-loop charge coupled device (CCD) shift register structured according to the invention. Since there is no suitable circuit symbol to describe a CCD device which can shift information either horizontally or vertically, as some of the CCD devices in FIG. 1 do, description of both the structure and operation herein is set forth with respect to FIG. 1, with the further aid of the timing diagram of FIG. 2 and the information flow diagram of FIG. 3. The CCD cells in FIG. 1 are of the two phase variety. For a more complete description of two phase charge coupled devices, see the article "Two-Phase Charge Coupled Devices with Overlapping Polysilicon and Aluminum Gate" by Kosonocky and Carnes, RCA Review, Volume 34, March, 1973, which is incorporated herein by reference.

Referring to FIG. 1, serial-parallel-loop CCD register 10 includes a thin oxide region 22. An oxide region 22 includes a horizontal bar-like section 22E, and includes 4 loops which begin and terminate in horizontal section 22E. For example, the first loop includes left hand portion 22A and right hand portion 22B. The second loop includes left hand portion 22C, which loops around to merge with right hand portion 22D, which merges with horizontal portion 22E. The other loops are similarly formed. The digital information represented by presence or absence of charge packets always moves along the above loop portions and horizontal portion 22E of the thin oxide region 22 at the surface of the semiconductor beneath the thin oxide region 22. The oxide is not uniformly thin: the portions of thin oxide under the polycrystalline silicon electrodes are thinner than the portions of region 22 beneath the metal electrodes. For a more descriptive view of the vertical structure of CCD, see the above mentioned Kosonocky and Carnes reference, and also see U.S. Pat. No. 3,947,863, by Powell, assigned to this assignee, all incorporated herein by reference. CCD register 10 includes a metal $\phi 2$ clock conductor 11, which contacts a number of regions of polycrystalline silicon. For example, $\phi 2$ conductor 11 contacts polycrystalline silicon conductor 13 through preohmic contact 14, and similarly contacts polycrystalline silicon conductors 15 and 16 through other preohmic openings shown in the drawing. Polycrystalline regions 13, 15, etc. join together with substantially horizontal, but rather zigzagged, polycrystalline region 14A, which forms the $\phi 2$ electrode for the abovementioned loops. Regions 13, 15 and 16, etc., also form electrodes for CCD cells which are coupled sequentially along horizontal thin oxide region 22E.

$\phi 2A$ metal conductor 12 has four vertical extensions which overlap portions of thin oxide region 22E and also portions of polycrystalline silicon regions 13, 15, 16, etc. "Launch B" metal region 18 contacts polycrystalline silicon region 19 by means of preohmic contact 19A. Polycrystalline silicon region 19 overlaps a portion of horizontal thin oxide region 22E abutting the portion thereat covered by the lefthand vertical member of $\phi 2A$ conductor 12, and also covers a portion of thin oxide region lefthand vertical portion 22E.

"Launch A" metal region 20 overlaps the lefthand extremity of horizontal thin oxide region 22E and covers that area abutting the portion covered by polycrystalline silicon layer 19. The lefthand extreme portion of horizontal thin oxide section 22E overlies a diffused region 21, which is formed by a diffused region in the substrate on which CCD register 10 is formed. For example, region 21 might be a P type source region if the substrate is a N type substrate.

Diffused region 24 is contacted via preohmic contact 26 to $\phi 1$ metal conductor 25. $\phi 1$ conductor diffused conductor 24 contacts three metal regions similar to metal region 27, which contacts $\phi 1$ diffused region 24 by means of preohmic contact 28. Each of the metal regions similar to region 27 contacts a respective polycrystalline region similar to 27A by means of a preohmic contact similar to 27B. These metal regions and polycrystalline silicon regions form or describe regions which could be referred to as phase 1 locations or first phase locations of the thin oxide region. As mentioned above, the oxide thickness beneath the metal electrodes is thicker than beneath the polycrystalline silicon electrodes.

$\phi$2B metal conductor 33 includes an upper zigzagged, essentially horizontal region 33A which covers a portion of thin oxide region 22A adjacent the region of 22A covered by polycrystalline silicon conductor 19 and covers a portion of thin oxide region 22B adjacent to the portion of 22B covered by polycrystalline zigzagged horizontal member 14A. The manner in which polycrystalline silicon conductor 14A and metal $\phi$2B conductor 33A covers the other loop members is apparent from the drawing. $\phi$2B metal member 33 also contacts a zig-zag horizontal polycrystalline silicon member 33C through ohmic contact 35.

$\phi$1A metal conductor 30 includes a zig-zag horizontal member 30A which covers the portions of thin oxide loop members 22A, 22C, 22F and 22H adjacent those portions of the same members covered by polycrystalline silicon member 14A. $\phi$1A metal conductor 30 also contacts polycrystalline silicon zig-zag horizontal member 30C by means of preohmic contact 32. $\phi$1A polycrystalline silicon zig-zag horizontal member 30C contacts those portions of thin oxide region 22A, 22C, 22F and 22H adjacent those portions of the same member contacted by $\phi$1A metal horizontal zig-zag number 30A and covers those portions of thin oxide loop numbers 22B, 22D, 22G and 22J adjacent, to those portions of the same members contacted by $\phi$2B horizontal zigzag conductor 33A. Similarly, polycrystalline zig-zag conductors 33C and metal conductor 33D are interwoven to overlap the thin oxide loop members in the same fashion.

All of the above recitation simply sets forth structure which those skilled in the art will clearly see to constitute a consecutive sequence of four two-phase CCD cells, together with one respective CCD cell, along horizontal thin oxide area 22E to form each of the four CCD loops of register 10. Diffused region 40, overlapped by the righthand end of thin oxide area 22E, forms the output of CCD register 10. Output 40 would be a suitable place to insert a MOS regeneration inverter, as mentioned hereinbefore.

The area of thin oxide region 22E outlined by dotted line 101 is location of the first sequentially coupled CCD cell of the row of CCD cells along 22E. 102 outlines the CCD cell adjacent to the CCD cell outlined by 101. The thin oxide region under metal region 27 and polycrystalline silicon region 27A constitutes the "phase 1 location", or "first phase location" of that CCD cell and the portion of thin oxide area under $\phi$2A conductor 12 within 102 along with the portion of $\phi$2 polycrystalline silicon member 15 within 102 together form the "phase 2 location" or "second phase location" within CCD cell 102. Similarly, within cell 101, the thin oxide in region under polycrystalline silicon number 19 and metal number 20 form the phase 1 location, while the portions $\phi$2A conductor 12 and $\phi$2 polycrystalline silicon number 13 form the phase 2 location.

Dotted line 103 illustrates two sequential storage cells of the loop including thin oxide regions 22A and 22B.

Figure 3:
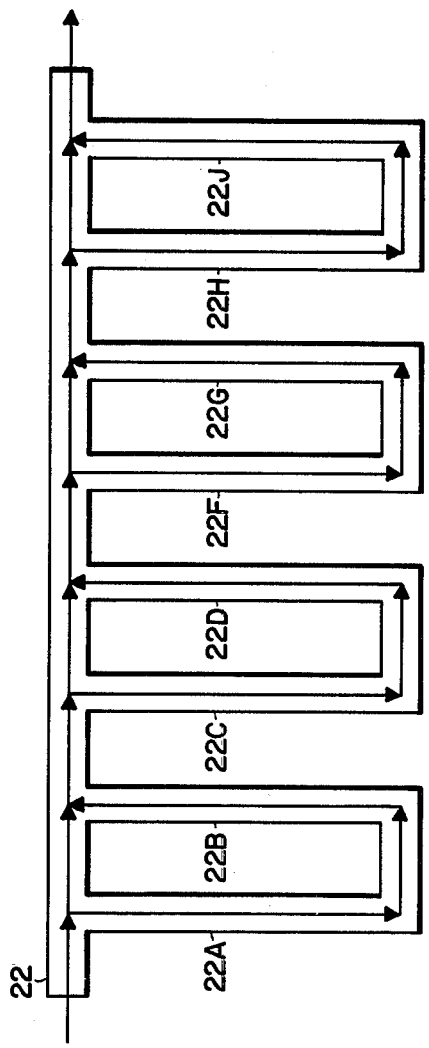
FIG. 3 is a diagram indicating the general direction of flow of charge packets within the register of FIG. 1.

Before the detailed operation is set forth, it will be helpful to refer to FIG. 3. The thin oxide region 22 is shown in FIG. 3, and the top horizontal number 22E and the members of the loops are designated using the same reference numerals as in FIG. 1. Eight arrows indicate how the charge packets are transferred. There are four CCD cells along horizontal member 22E, and also four CCD cells (although there could be any number) in each of the loops. During the operation, a 4 bit word is clocked into the four CCD cells along member 22E. This takes four cycles according to the clock rate established by clock signal $\phi$1 and $\phi$2. The clocking arrangement is such that after the four top CCD cells are filled with charge pockets during the next cycle they do not shift further to the right, but instead shift downward into the first CCD cell of each of the four loops. This occurs during the fifth $\phi$1 pulse period prior to the first downward shift. The information represented by each of the 4 bits is stored in the phase 1 location of the respective four CCD cells, and is shifted into the first phase 2 location of each of the cells, that is, the first CCD cell of each loop. Next, another 4 bit word is shifted into the phase one positions along the top row of CCD cells. During the same time, the charge packet in the first CCD cell of each of the four loops is shifted downward only once, leaving the first CCD cell vacant. Next, the second 4 bit word is shifted downward. This operation keeps repeating until each loop is filled, that is each of the CCD cells on each loop is filled. Once the loops are filled, the next shifting of the information in the four loops is from the uppermost bit in each of the righthand members of each of the loops into the phase two location of each of the 4 bits along 22E. The original 4 bit word is therefore located again in the top four CCD cells, in their respective phase two locations, and is shifted out the righthand end of 22E just ahead of the fifth 4 bit word being loaded into the phase one locations along 22E.

Figure 2:
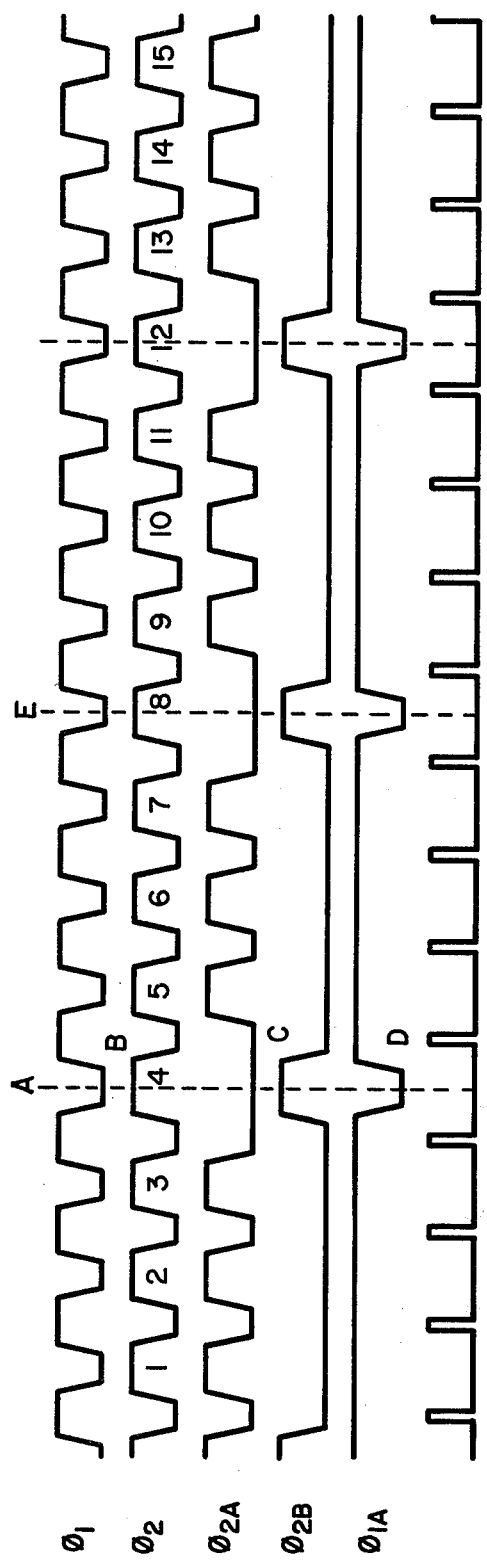
FIG. 2 is a timing diagram of clock signals and waveforms associated with the operation of the embodiment of FIG. 1.

Referring again to FIG. 1, and also to the timing diagram in FIG. 2, the first event that happens is that launch B conductor 18 goes positive in phase with the $\phi$1 waveform in FIG. 2. Diffused region 21 at the same time is forward biased with respect to the substrate, not shown, which causes injection of a packet of charge which gets trapped under polycrystalline electrode 19 in regions 22E and 22A covered by region 19. As a result of the next three positive pulses of $\phi$1 and the associated pulses of $\phi$2, the charge packet shifts to the right along thin oxide region 22E, so that at time A in FIG. 2 charge packets corresponding to the first 4 bit word are contained in the phase one locations of each of the top four CCD cells. During this time, $\phi$2A has remained in phase with $\phi$2 until the fourth positive transition of $\phi$2. At this point, $\phi$2A, stays low, blocking any further shifting to the right of charge packets of the word during $\phi$2 pulse 4. (Note that the $\phi$2 pulses are numbered in FIG. 2.) During the previous four $\phi$1 pulses, $\phi$2B has remained low and $\phi$1A has remained high. Just prior to time A, $\phi$2B goes high to level C and $\phi$1A goes low to level D, causing the charge packets in the phase one locations of each of the top 4 bits along 22E to be shifted downward, instead of to the right. For the next four $\phi$ pulses, the second 4 bit word is shifted into the four top sequentially connected CCD cells, to their phase one locations. This brings us to time E on FIG. 2, and as $\phi$2 goes positive during pulse 8, $\phi$2A again remains negative, and $\phi$2B, which had gone negative as shown in FIG. 2, again goes positive and $\phi$1A goes negative as shown at time E. This causes the second 4 bit word to be shifted downward, however, the first word had been shifted downward at one further bit at the same time. The process of loading a word into the top 4 bits and shifting it downward continually occurs, and by the fifth time it happens each of the CCD loops are filled, so the charge packets are being shifted down the lefthand members and up the righthand members of each of the CCD loops. The righthand members terminate at the phase two locations of each of the respective top four sequentially coupled CCDs, so the words shifted earlier into the four loops in parallel from the phase one positions are shifted back to the phase two positions of the top four CCD's along 22E each time $\phi$1A goes positive after the first four cycles. Thus, each 4 bit word is subsequently shifted out of the register at diffused region 40 just ahead of the loading of each new 4 bit word.

It is seen that a total of five 4 bit words of information are continually being temporarily stored in and shifted through serial-parallel-loop CCD register 10, so that with respect to its input 21 and its output 40 it appears to look like a 20 bit (or 24 bit) CCD shift register with a clock rate equal to the clock rate of the $\phi$1 and $\phi$2 signals. Serial-parallel-loop CCD register 10 has the advantage that all of the space on the semiconductor body on which it is constructed is efficiently utilized. Upon some consideration, it can be seen that each charge packet only undergoes 16 transfers from the time it enters input 21 to the time it leaves output 40 as opposed to 40 shifts which would be required if all 20 CCD cells were sequentially coupled together. Therefore, fewer charge regenerators are required for this type of device.

It will be easily recognized that the number of sequentially coupled CCD cells constituting each loop can be any number, and does not have to be the number of cells along the top row.

What is claimed is:

1. A serial-parallel-loop charge-coupled device storage means in a semiconductor substrate having a plurality of charge-coupled device cells, each cell having a first phase location and a second phase location associated therewith, the first phase location being defined as a first charge storage region in said substrate responsive to a first phase clock potential applied to an electrode insulated from the first charge storage region and the second phase location being defined as a second charge storage region in said substrate responsive to a second phase clock potential applied to an electrode insulated from the second charge storage region, comprising: a first group of sequentially coupled charge-coupled device cells each cell having a first phase location and a second phase location associated therewith; a second group of charge coupled device cells arranged to form loops, each of said loops beginning at the first phase location of a respective one of said sequentially coupled charge-coupled device cells and ending at the second phase location of said one of said sequentially coupled charge-coupled device cells; and clocking means coupled to said plurality of sequentially coupled charge-coupled device cells and to said plurality of charge-coupled device cells arranged to form loops for effecting shifting of bits of information in the form of charge packets into said first phase locations of said plurality of sequentially coupled charge-coupled device cells at a first clocking rate and effecting shifting of the bits of information from said respective first phase locations into said respective loops and around said loops and into second phase locations of said plurality of sequentially coupled charge-coupled device cells at a second slower clocking rate.

2. The series-parallel-loop charge-coupled device means as recited in claim 1 wherein each of said charge-coupled device loops includes a first number of sequentially coupled charge-coupled device cells each having a first phase location and a second phase location.

3. The serial-parallel-loop charge-coupled device means as recited in claim 2 wherein the first charge-coupled device cell of each of said loops has its second phase location adjacent the first phase location of its respective charge-coupled device cell of said first group.

4. The serial-parallel-loop charge-coupled device means as recited in claim 3 wherein the last charge-coupled device cell of each of said loops has its first phase location adjacent the second phase location of its respective charge-coupled device cell of said first group.

5. The serial-parallel-loop charge-coupled device means as recited in claim 3 wherein all of said charge-coupled device cells are two phase charge-coupled device cells.

6. The series-parallel-loop charge-coupled device means as recited in claim 5 wherein said clocking means includes a first means overlying the first phase location of said first charge-coupled device of said first group for loading information from an input of said serial-parallel-loop charge-coupled device means into said first phase location of said first charge-coupled device, and further includes second means overlying a portion of the second phase location of said first charge-coupled device adjacent said first phase location of said first charge-coupled device for controllably effecting or inhibiting transfer of information from said first phase location to said adjacent second phase locations of said first charge-coupled device cell in said first group.

7. The serial-parallel-loop charge-coupled device means as recited in claim 6 wherein said clocking means further includes third means overlying a remaining portion of said second phase location of said first charge-coupled device cell and also overlying a corresponding portion of the second phase locations of each of the charge-coupled device cells in said first group for effecting timely transfer of information in said second phase locations of said first group to adjacent first phase locations of said first group.

8. The serial-parallel-loop charge-coupled device means as recited in claim 6 wherein said second means also overlies corresponding portions of the second phase locations of the remaining charge-coupled device cells in said first group.

9. The serial-parallel-loop charge-coupled device means as recited in claim 7 wherein said third means also overlies a portion of the first phase location of the first and last charge-coupled device cells of each of said loops.

10. The serial-parallel-loop charge-coupled device means as recited in claim 9 wherein said clocking means further includes fourth means overlying remaining portions of said first phase locations of said first and last charge-coupled device cells of said loops.

11. A charge-coupled device memory for storing data having a plurality of charge-coupled device cells in a semiconductor substrate, each charge-coupled device cell having a first and a second phase location, the first phase location being defined as a first charge storage region in the semiconductor substrate responsive to a first phase clock potential applied to an electrode insulated from the first charge storage region and the second phase location being defined as a second charge storage region in the semiconductor substrate responsive to a second phase clock potential applied to an electrode insulated from the second charge storage region, comprising a first plurality of charge-coupled device cells forming a serial input for the memory, and a plurality of storage means coupled to the serial input and each storage means forming a loop storage associated with each of the first plurality of charge-coupled device cells, each of the plurality of storage means having a second plurality of charge-coupled device cells arranged to have a second phase location of one of the second plurality of charge-coupled device cells to be juxtaposed to the first phase location of one of the first plurality of charge-coupled device cells and to have a first phase location of another of the second plurality of charge-coupled device cells to be juxtaposed to the second phase location of the one of the first plurality of charge-coupled device cells, to make use of the first plurality of charge-coupled device cells as a serial output in addition to being a serial input.

12. The charge-coupled device memory of claim 11 further including clock means to clock the information through the memory.

13. The charge-coupled device memory of claim 12 wherein all of the charge-coupled device cells are two phase charge-coupled device cells.

* * * * *